(12) United States Patent
Koll et al.

(10) Patent No.: US 6,842,369 B2
(45) Date of Patent: Jan. 11, 2005

(54) INTERMESH MEMORY DEVICE

(75) Inventors: Andrew Koll, Albany, OR (US); Peter Fricke, Corvallis, OR (US); Andrew L. Van Brocklin, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 127 days.

(21) Appl. No.: 10/141,609

(22) Filed: May 7, 2002

(65) Prior Publication Data

US 2003/0210567 A1 Nov. 13, 2003

(51) Int. Cl.$^7$ ................................................. G11C 7/00
(52) U.S. Cl. ......................... 365/174; 365/63; 365/158; 365/225.7
(58) Field of Search ............................. 365/174, 225.7, 365/158, 63, 94, 96, 103, 164

(56) References Cited

U.S. PATENT DOCUMENTS

| | | | |
|---|---|---|---|
| 4,287,571 A | 9/1981 | Chakravarti et al. | |
| 4,872,140 A | 10/1989 | Graham et al. | |
| 4,970,686 A | * 11/1990 | Naruke et al. | 365/96 |
| 5,101,377 A | 3/1992 | Yamada | |
| 5,835,396 A | * 11/1998 | Zhang | 365/51 |
| 5,963,472 A | * 10/1999 | Inada et al. | 365/175 |
| 6,124,729 A | 9/2000 | Noble et al. | 326/41 |
| 6,229,169 B1 | 5/2001 | Hofmann et al. | 257/296 |
| 6,288,431 B1 | 9/2001 | Iwasa et al. | 257/401 |
| 6,324,104 B1 | 11/2001 | Matsui | 365/200 |
| 6,350,635 B1 | 2/2002 | Noble et al. | 438/156 |
| 6,351,406 B1 | * 2/2002 | Johnson et al. | 365/103 |
| 6,353,569 B1 | 3/2002 | Mizuno et al. | 365/210 |
| 6,525,953 B1 | * 2/2003 | Johnson | 365/63 |
| 2002/0041525 A1 | 4/2002 | Butz | |

* cited by examiner

*Primary Examiner*—Son T. Dinh

(57) ABSTRACT

An intermesh memory device includes memory components that each have a determinable resistance value and electronic switches that each control current through one or more of the memory components such that a potential is applied to the memory components. A first electronic switch of the intermesh memory device is electrically coupled to an input of a memory component and a second electronic switch is electrically coupled to an output of the memory component. The first electronic switch and the second electronic switch are configured together to apply a potential to the memory component.

59 Claims, 11 Drawing Sheets

INTERMESH MEMORY DEVICE

TECHNICAL FIELD

This invention relates to a memory device, and in particular, to an intermesh memory device.

BACKGROUND

Conventional read-only memory (ROM) circuits are implemented as special-purpose integrated circuits for the permanent storage of program instructions and electronic data. For example, a ROM circuit can be manufactured with specific instructions for the operation of a computer system.

Typically, a ROM circuit consists of an array of memory cells on a semiconductor, and each memory cell has a transistor that is fabricated to indicate a logic "one" or a logic "zero" based on how the semiconductor is implanted to create the transistor. The data is permanently stored with a memory cell, and it cannot then be erased or altered electrically. Each of the transistors can be formed so as to have one of the two predetermined logic values.

A programmable ROM (PROM) circuit is designed with memory cells having programmable memory components that can be programmed after the semiconductor chip has been manufactured. The memory cells of a PROM device are programmed with data (e.g., a logic one or a logic zero) when the data is burned into the chip. This is accomplished by forming contacts that define the threshold voltage levels near the end of the manufacturing process, or after the manufacturing process. When a PROM device is programmed, the device can be implemented like a conventional ROM chip in that the data cannot be electrically altered.

Due to the costs of fabricating semiconductor memory devices, and the design of smaller integrated circuit-based electronic devices, there is an ever-present need to provide non-volatile memory circuits that take up less space, have improved memory storage capacity, and are inexpensive to manufacture.

SUMMARY

An intermesh memory device includes memory components that each have a determinable resistance value and electronic switches that each control current through one or more of the memory components such that a potential is applied to the memory components. A first electronic switch of the intermesh memory device is electrically coupled to an input of a memory component and a second electronic switch is electrically coupled to an output of the memory component. The first electronic switch and the second electronic switch are configured together to apply a potential to the memory component.

BRIEF DESCRIPTION OF THE DRAWINGS

The same numbers are used throughout the drawings to reference like features and components.

DETAILED DESCRIPTION

The following describes an intermesh memory array that includes write-once memory components which can be implemented in a memory device for fast read and write access. The intermesh memory array architecture is much faster than conventional memory devices and can be implemented as a programmable read-only memory device for a digital memory application, such as a compact flash memory for a digital camera for example. Further, the memory devices can be less expensive to manufacture and can be smaller, yet have more memory capacity than conventional memory devices. Less expensive and smaller memory devices provide greater design flexibility for integrated circuit-based electronic devices.

In an implementation, an intermesh memory device is configured with a first array of memory components and a second array of memory components. The memory components that form the first memory array intersect, overlap, and/or are substantially perpendicular to the memory components that form the second memory array. For example, memory components that form the first memory array are formed in rows in an x-dimension and the memory components that form the second memory array are formed in columns in a y-dimension, such that the memory components in the two memory arrays intersect perpendicularly.

The memory components that form the first and second memory arrays are coupled to pillars which are conductive vias in the intermesh memory device that alternate between drive and sense and are activated with complementary logic levels. The memory components are electrically coupled between each adjacent drive and sense pillar. The intermesh memory device architecture provides that two adjacent rows of pillars can be driven and all of the columns sensed, or two adjacent columns of pillars driven and all of the rows sensed.

General reference is made herein to various examples of memory devices. Although specific examples may refer to memory devices having particular memory component implementations, such examples are not meant to limit the scope of the claims or the description, but are meant to provide a specific understanding of the data storage techniques described herein. Furthermore, it is to be appreciated that the described memory components are exemplary, and are not intended to limit application of the data storage techniques. Accordingly, other memory devices having components different from and/or in addition to those described herein can be used to implement the described intermesh memory device.

Exemplary Intermesh Memory Devices

Figure 1:
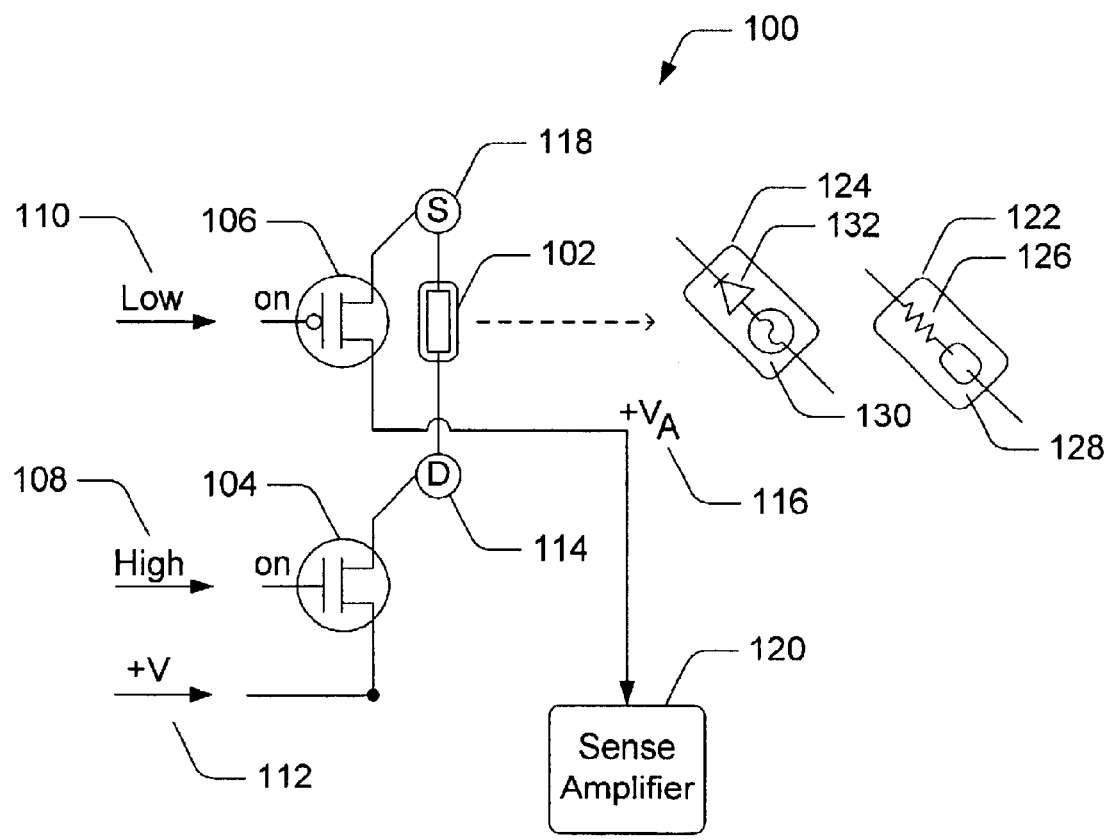
FIG. 1 illustrates an embodiment of a memory component electrically coupled to electronic switches, and exemplary memory components.

FIG. 1 illustrates an exemplary memory circuit 100 that includes an embodiment of a memory component 102 electrically coupled to electronic switches 104 and 106. Electronic switch 104 is implemented as an n-channel field effect transistor (FET) that is electrically coupled to memory component 102. The transistor 104 has a high voltage 108 applied to turn the transistor on such that current flows through the transistor. Electronic switch 106 is implemented as a p-channel FET that is also electrically coupled to memory component 102. The transistor 106 has a low voltage 110 applied to turn the transistor on such that current flows through the transistor. Those skilled in the art will recognize that "high" and "low" voltages as described herein are relative to each other such that a high voltage, such as high voltage 108, is implemented at transistor operational levels and is a relatively higher voltage than low voltage 110. Conversely, a low voltage is a relatively lower voltage than a high voltage.

When both of the transistors 104 and 106 are turned on with the applied high voltage 108 and low voltage 110, respectively, a potential is applied to memory component 102. The potential is derived from a positive drive voltage 112 (+V) at an input, or drive node 114, of memory component 102 and from a sense voltage 116 (+$V_A$) at an output, or sense node 118, of memory component 102. A sense amplifier 120 senses the resistance value of memory component 102. The sense amplifier 120 can be implemented with sense amplifiers that include a differential, analog, or digital sense amplifier.

Memory component 102 can be implemented with any type of electrically resistive material, such as an oxide, in an integrated circuit and/or as a resistive memory component, such as with a resistor. Those skilled in the art will recognize that many different combinations of materials and designs are available to fabricate memory devices and the memory components. Exemplary memory components 122 and 124 can be implemented as memory component 102 in memory circuit 100. Memory component 122 is implemented with a resistor 126 connected in series with a control element 128. Memory component 124 is implemented with an anti-fuse device 130 connected in series with a diode 132. Further, a memory component can be implemented with an anti-fuse device connected in series with a control element.

A control element, such as control element 128 in memory component 122, functions to allow the selection of a particular memory component in an array of memory components forming a memory device. The control element 128 can be implemented with a linear or nonlinear resistor, a tunnel junction diode, a tunnel diode, an anti-fuse device, or a Schoftky, PN, or PIN semiconductor diode.

An anti-fuse device, such as anti-fuse device 130 in memory component 124, is a tunnel-junction, one-time programmable device. The tunnel-junction of an anti-fuse device is a thin oxide junction that electrons "tunnel" through when a pre-determined, relatively high potential is applied across the anti-fuse device. The applied potential causes an electrical connection when the oxide junction is destroyed creating a short having a low resistance value. Anti-fuse device 130 can be implemented with any number of available components and types of fuses or anti-fuses, such as a LeComber, Silicide, Tunnel Junction, Oxide Rupture, or any other similar fuse components. Further, anti-fuse device 130 can be implemented with any number of re-writeable data storage elements.

Figure 2:
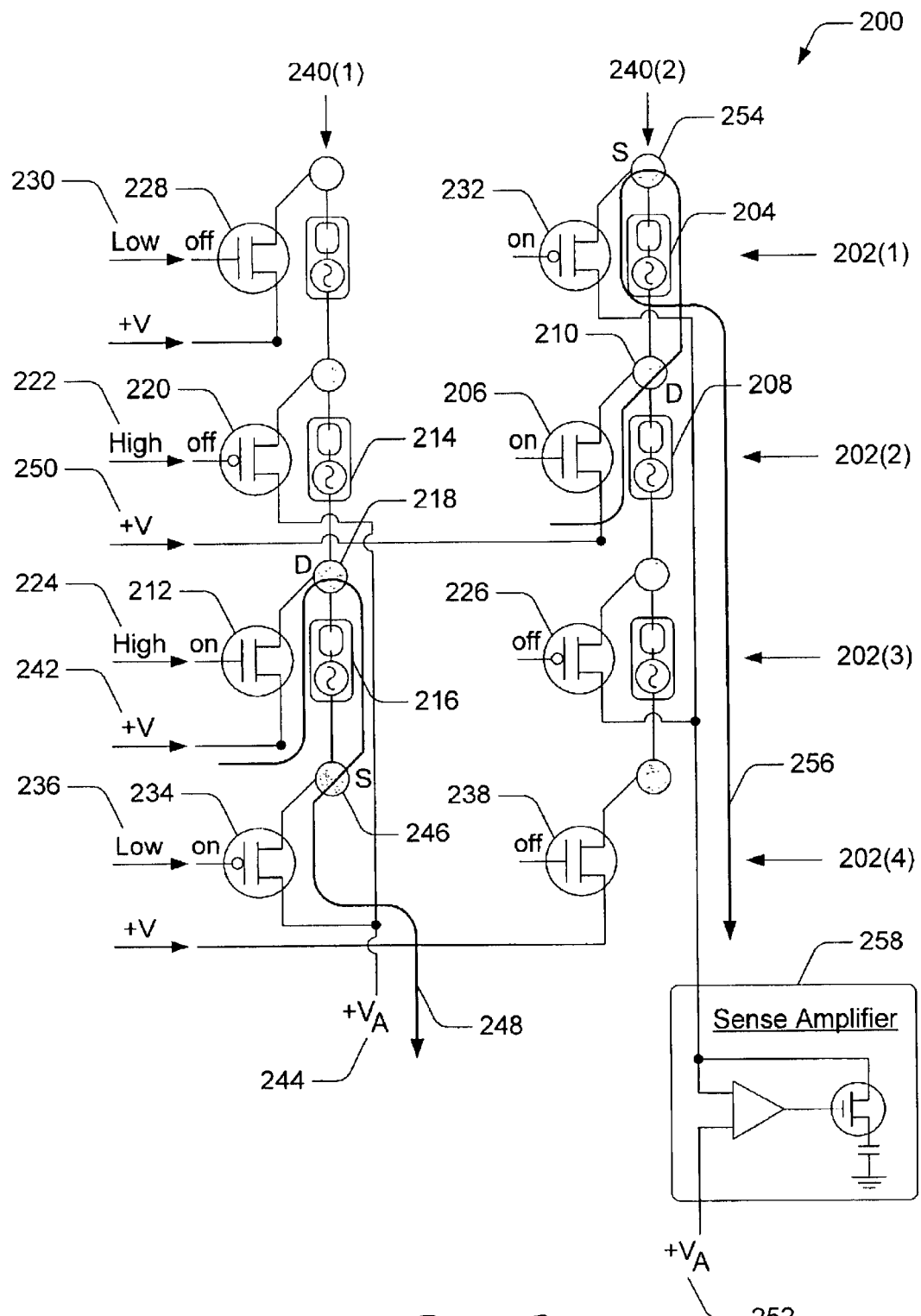
FIG. 2 illustrates an embodiment of a schematic section of a memory array formed with an exemplary memory component and electronic switches shown in FIG. 1.

FIG. 2 illustrates a schematic section of an embodiment of a memory array 200 formed with rows 202 (1–4) of memory components and transistor electronic switches similar to those shown in FIG. 1. For illustrative purposes, the memory components, such as memory component 204, are each shown as an anti-fuse device connected in series with a control element. Alternatively, the memory components can be implemented with any combination of resistive memory devices and control elements as described with reference to memory component 102 (FIG. 1).

Further, the memory components in memory array 200 (and other memory component examples described herein) can be implemented with any re-writeable data storage elements as well as any programmable, write-once memory components, such as the exemplary memory component 124 implemented with an anti-fuse device 130 in series with a diode 132 as shown in FIG. 1. Alternatively, the memory components can be implemented with one of many different combinations of materials and designs that are available to fabricate memory cells for memory devices.

In memory array 200, the electronic switches are implemented as alternating n-channel FETs and p-channel FETs that are each electrically coupled to one or more of the memory components. For example, transistor 206 is electrically coupled to memory component 204 and to memory component 208 at a node, or connection point 210. Similarly, transistor 212 is electrically coupled to memory components 214 and 216 at a node, or connection point 218.

In memory array 200, two adjacent rows 202(2) and 202(3) of transistors are driven high, while the remaining rows of transistors in memory array 200 have a low voltage applied. In row 202(2), a p-channel FET 220 has a high voltage 222 applied to turn the transistor off while the n-channel FET 206 is turned on when high voltage 222 is applied. Similarly, in row 202(3), the n-channel FET 212 has a high voltage 224 applied to turn the transistor on while a p-channel FET 226 is turned off when high voltage 224 is applied.

In row 202(1), an n-channel FET 228 has a low voltage 230 applied to turn the transistor off while a p-channel FET 232 is turned on when low voltage 230 is applied. Similarly, In row 202(4), a p-channel FET 234 has a low voltage 236 applied to turn the transistor on while an n-channel FET 238 is turned off when low voltage 236 is applied. Those skilled in the art will recognize that the applied transistor high and low voltages are relative to each other such that a high voltage, such as high voltages 222 and 224, are implemented at transistor operational levels and are a higher voltage than low voltages 230 and/or 236. Further, any two adjacent rows in a memory array can be driven high while the remaining rows in the memory array are driven low, or remain low. Additionally, the circuit logic can be inverted such that any two adjacent rows of alternating n-channel FETs and p-channel FETs are driven low while the remaining rows in the memory array are driven high.

When any two adjacent rows of transistors are driven high, such as the transistors in rows 202(2) and 202(3), a potential is applied to a single memory component in each column 240 of memory array 200 such that a resistance value of a memory component in a column can be determined. For example, when both of the transistors 212 and 234 in column 240(1) are turned on with the applied high voltage 224 and low voltage 236, respectively, a potential is applied to memory component 216. The potential is derived from a positive drive voltage 242 (+V) at an input, or drive node 218, of memory component 216 and from a sense voltage 244 (+$V_A$) at an output, or sense node 246, of memory component 216. A current path 248 is created through transistor 212, memory component 216, and transistor 234.

Similarly, when both of the transistors 206 and 232 in column 240(2) are turned on with the applied high voltage 222 and low voltage 230, respectively, a potential is applied to memory component 204. The potential is derived from a positive drive voltage 250 (+V) at an input, or drive node 210, of memory component 204 and from a sense voltage 252 (+$V_A$) at an output, or sense node 254, of memory component 204. A current path 256 is created through transistor 206, memory component 204, and transistor 232. A sense amplifier 258 senses the resistance value of memory component 204. The sense amplifier 258 can be implemented with sense amplifiers that include a differential, analog, or digital sense amplifier.

Figure 3:
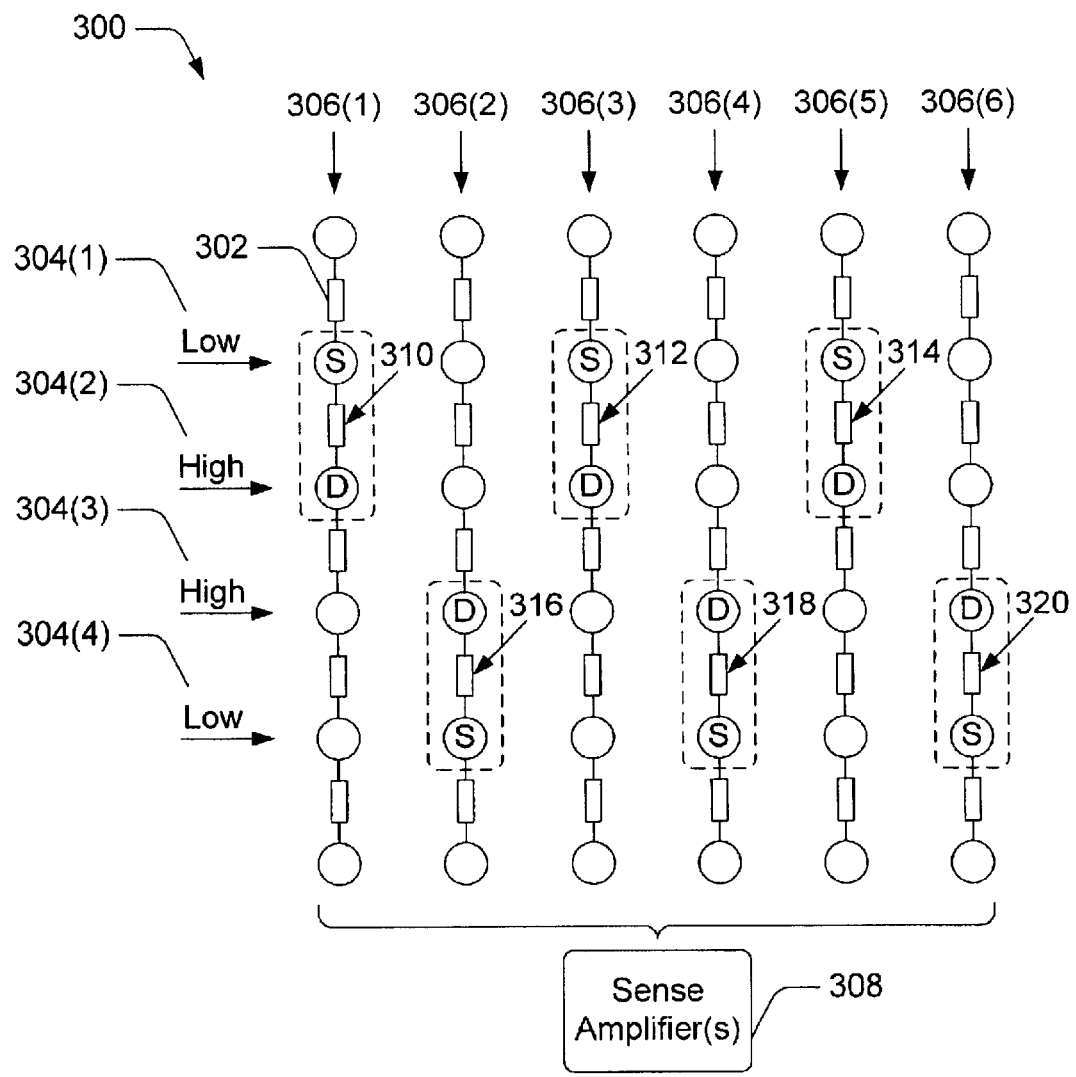
FIG. 3 illustrates an embodiment of a memory array formed with an embodiment of an exemplary memory component and electronic switches shown in FIG. 1.

FIG. 3 illustrates a section of an embodiment of a memory array 300 formed with rows of memory components 302 and transistor electronic switches as shown in FIGS. 1 and 2. FIG. 3 further illustrates that when any two adjacent rows of transistors are driven high, such as in rows 304(2) and 304(3), a potential is applied to a memory component in each column 306 of memory array 300 such that a resistance value of a memory component in any column can be determined. One or more sense amplifiers 308 sense the resistance value of a memory component in a selected column 306.

For example, when row 304(2) is driven high, every other transistor in the row is turned on to apply a drive voltage to a memory component in every other corresponding column. As described above, the transistors are implemented as alternating n-channel FETs and p-channel FETs that are turned on and/or off with high and low voltages applied. Row 304(1) is driven low such that every other transistor in each column corresponding to the transistors that are turned on in row 304(2) are also turned on to apply a sense voltage to the memory components. Thus, the resistance value of memory component 310 in column 306(1), memory component 312 in column 306(3), and memory component 314 in column 306(5) can all be determined at the same time.

Similarly, when row 304(3) is driven high, every other transistor in the row is turned on to apply a drive voltage to a memory component in every other corresponding column 306(2), 306(4), and 306(6). Row 304(4) is driven low such that every other transistor in each column corresponding the transistors that are turned on in row 304(3) are also turned on to apply a sense voltage to the memory components. Thus, the resistance value of memory component 316 in column 306(2), memory component 318 in column 306(4), and memory component 320 in column 306(6) can all be determined at the same time, along with memory components 310, 312, and 314.

Figure 4:
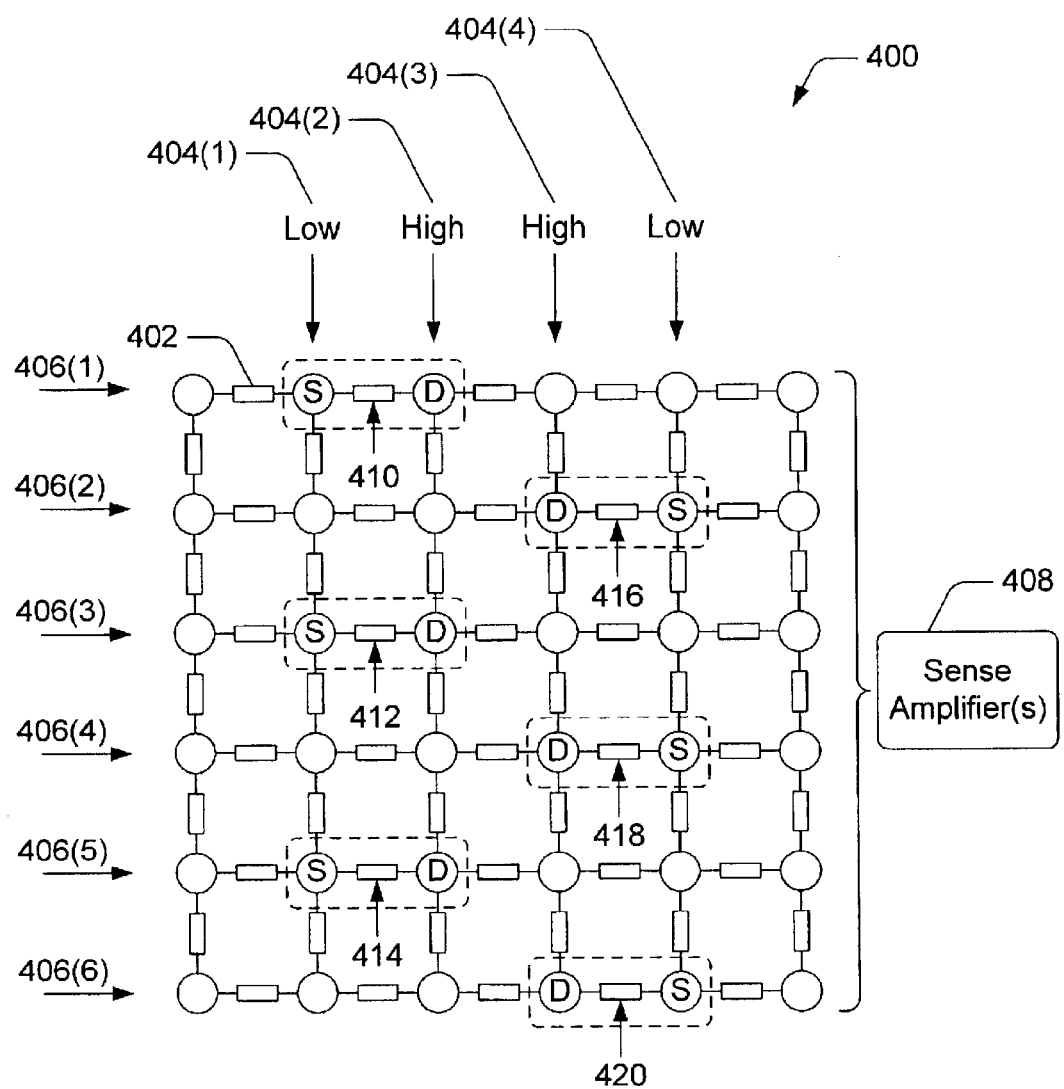
FIG. 4 illustrates an embodiment of an intermesh memory array formed with an embodiment of an exemplary memory component and electronic switches shown in FIG. 1.

FIG. 4 illustrates a section of an embodiment of an intermesh memory array 400 that is formed with rows of memory components (i.e., memory array 300 shown in FIG. 3) and additional columns of memory components 402.

Intermesh memory array 400 is also implemented with transistor electronic switches as shown in FIGS. 1 and 2. FIG. 4 shows that memory components 402 can be added to memory array 300 to form the intermesh memory array 400 in which either rows and/or columns of the memory components can be sensed at any one time.

FIG. 4 illustrates that when any two adjacent columns of transistors are driven high, such as in columns 404(2) and 404(3), a potential is applied to a memory component in each row 406 of memory array 400 such that a resistance value of a memory component in any row can be determined. One or more sense amplifiers 408 sense the resistance value of a memory component in a selected row 406.

For example, when column 404(2) is driven high, every other transistor in the column is turned on to apply a drive voltage to a memory component in every other corresponding row. As described above, the transistors are implemented as alternating n-channel FETs and p-channel FETs that are turned on and/or off with high and low voltages applied. Column 404(1) is driven low such that every other transistor in each row corresponding to the transistors that are turned on in column 404(2) are also turned on to apply a sense voltage to the memory components. Thus, the resistance value of memory component 410 in row 406(1), memory component 412 in row 406(3), and memory component 414 in row 406(5) can all be determined at the same time.

Similarly, when column 404(3) is driven high, every other transistor in the column is turned on to apply a drive voltage to a memory component in every other corresponding row 406(2), 406(4), and 406(6). Column 404(4) is driven low such that every other transistor in each row corresponding the transistors that are turned on in column 404(3) are also turned on to apply a sense voltage to the memory components. Thus, the resistance value of memory component 416 in row 406(2), memory component 418 in row 406(4), and memory component 420 in row 406(6) can all be determined at the same time, along with memory components 410, 412, and 414.

Figure 5:
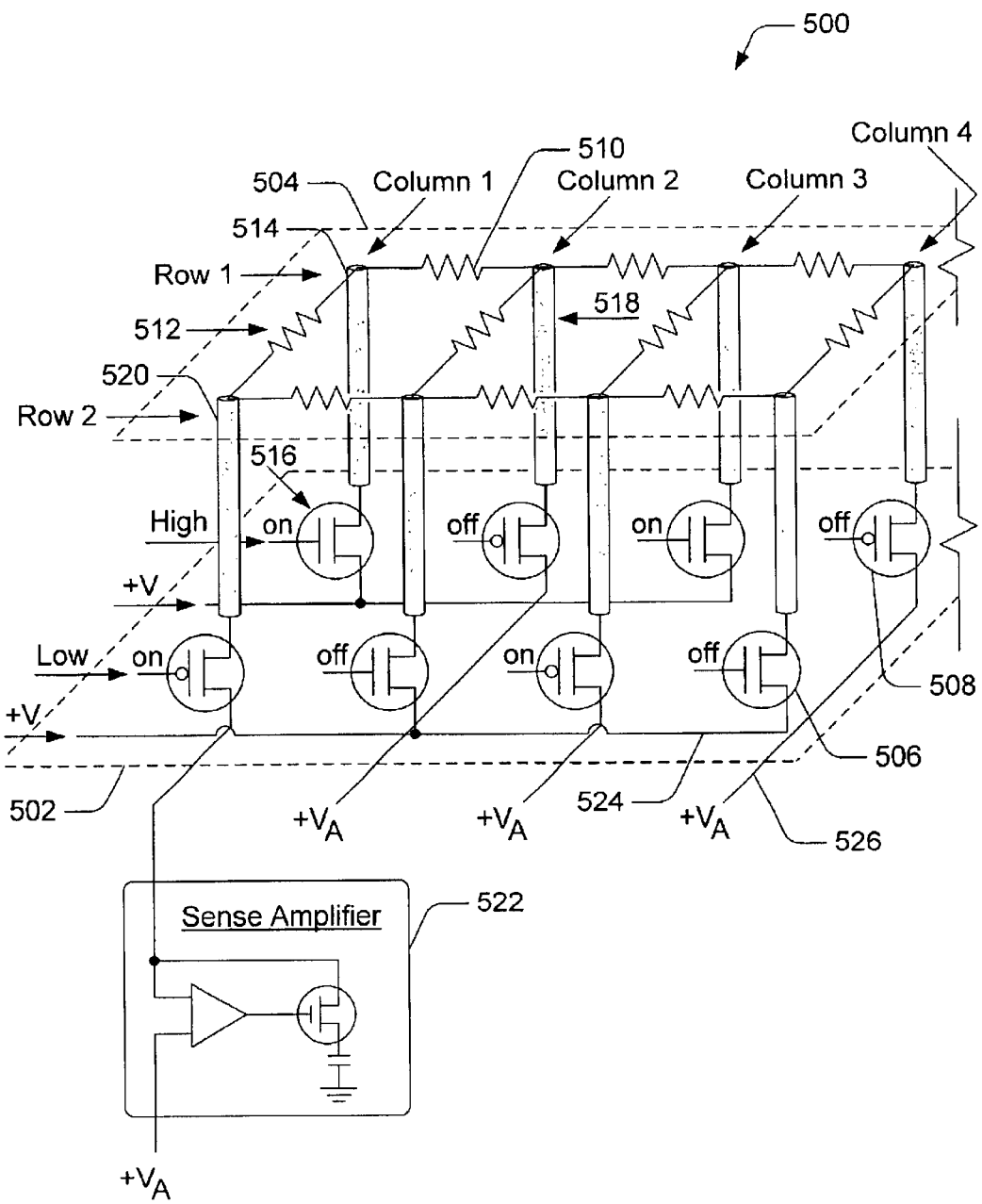
FIG. 5 illustrates an embodiment of an intermesh memory array shown as a schematic section in a vertical perspective.

FIG. 5 illustrates an embodiment of an intermesh memory array 500 shown as a schematic section in a vertical perspective. Intermesh memory array 500 has a semiconductor region 502 and a device region 504. The semiconductor region 502 includes electronic switches, such as an n-channel FET 506 and a p-channel FET 508, which are fabricated in semiconductive material on a semiconductor substrate with any fabrication and/or manufacturing process known to those skilled in the art. Device region 504 includes electrically resistive components, such as resistive memory components 510 and 512, that are fabricated in the device region which is offset from the semiconductive material.

Intermesh memory array 500 also includes electrically conductive vias, such as conductive via 514, which electrically couples an electronic switch (e.g., a transistor) to one or more of the electrically resistive components. For example, electrically conductive via 514 couples a transistor 516 to resistive memory components 510 and 512. Memory component 510 is electrically coupled to both conductive vias 514 and 518. Similarly, memory component 512 is electrically coupled to both conductive vias 514 and 520. The conductive vias can be fabricated with electrically conductive material such as copper or aluminum, or with alloys or doped silicon.

It is to be appreciated that the connection nodes, such as the input drive node 114 and output sense node 118 of memory component 102 (FIG. 1), the drive node 218 and sense node 246 of memory component 216 (FIG. 2), the drive node 210 and sense node 254 of memory component 204 (FIG. 2), and the drive and sense nodes illustrated in FIGS. 3 and 4 can be implemented as electrically conductive vias to offset the memory components from the transistor region of a memory device incorporating the memory arrays described herein.

Although the resistive memory components are illustrated as resistors in FIG. 5, the memory components can be implemented with any combination of resistive memory devices and control elements as described with reference to memory component 102 (FIG. 1). Further, the memory components in intermesh memory array 500 can be implemented with any re-writeable data storage elements as well as any programmable, write-once memory components, such as the exemplary memory component 204 implemented with an anti-fuse device connected in series with a control element (FIG. 2). To simplify the description, FIG. 5 shows only a few memory components and associated transistors. Those skilled in the art will appreciate that intermesh memory array 500 can be fabricated with any number of memory components, transistors, and other drive and sense circuitry, such as sense amplifier 522, as part of a memory device.

In practice, intermesh memory array 500 can be fabricated as a semiconductor memory device with any fabrication and/or manufacturing process known to those skilled in the art. Further, the voltage control lines, such as positive drive voltage line 524 (+V) and sense voltage line 526 (+$V_A$), can be fabricated above semiconductor region 502 in device region 504 which includes the electrically resistive components. Forming the voltage control lines and the memory components offset from the semiconductor substrate conserves space on the semiconductor substrate so that intermesh memory array 500 is a smaller memory device that provides greater design flexibility and density for integrated circuit-based electronic devices.

The term "semiconductor substrate", as used herein, includes semiconductive material and is not limited to bulk semiconductive material, such as a silicon wafer, either alone or in assemblies comprising other materials thereon, and semiconductive material layers, either alone or in assemblies comprising other materials. The term "substrate" refers to any supporting structure including but not limited to a semiconductor substrate which can be made of silicon, glass, gallium arsenide, silicon on sapphire (SOS), epitaxial formations, germanium, germanium silicon, diamond, silicon on insulator (SOI) material, selective implantation of oxygen (SIMOX) substrates, and/or like substrate materials. A substrate may also be made of plastic.

Figure 6:
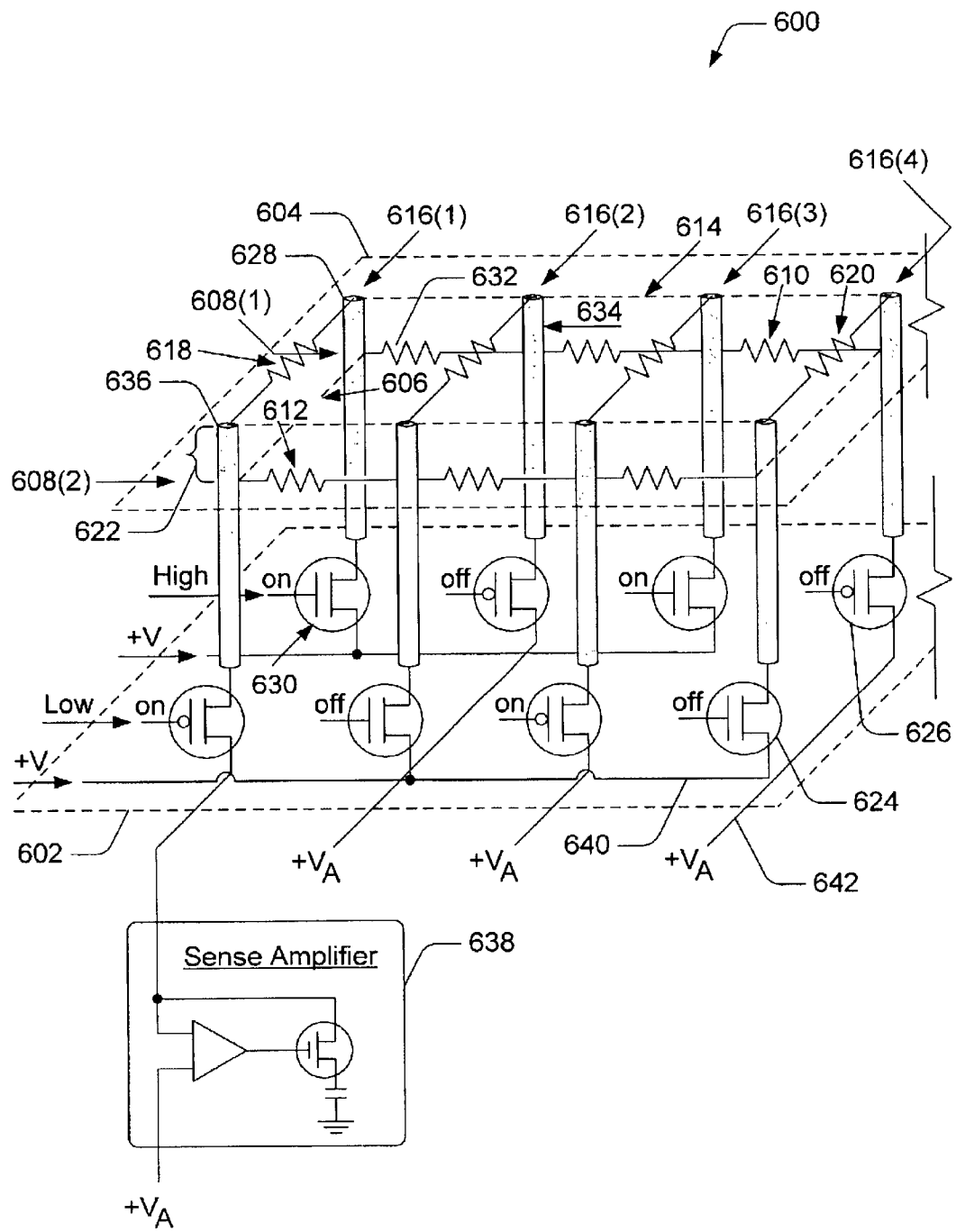
FIG. 6 illustrates an embodiment of an intermesh memory array shown as a schematic section in a vertical perspective.

FIG. 6 illustrates an embodiment of an intermesh memory array 600 shown as a schematic section in a vertical perspective, and as a variation of the intermesh memory array 500 shown in FIG. 5. Intermesh memory array 600 also has a semiconductor region 602 and a device region 604. The device region 604 includes a first memory array 606 that includes the resistive memory components in rows 608, such as memory component 610 in row 608(1) and memory component 612 in row 608(2). The device region also includes a second memory array 614 that includes the resistive memory components in columns 616, such as memory component 618 in column 616(1) and memory component 620 in column 616(4).

The first memory array 606 is offset 622 from the second memory array 614. Those skilled in the art will recognize that memory arrays 606 and 614 can be fabricated together or independently with any known semiconductor fabrication and/or manufacturing process. Further, the first set of memory components in rows 608 that form the first memory array 606 intersect, overlap, and/or are substantially perpendicular to the second set of memory components in columns 616 which form the second memory array 614. Those skilled in the art will recognize that although the sets of memory components are described and illustrated as perpendicular, or substantially perpendicular, in practice the memory components can be implemented in any one of many positions and configurations, to include memory components that are perpendicular on a horizontal plane, both vertical and horizontal on two planes, perpendicular on a vertical plane, and the like.

The semiconductor region 602 includes transistors, such as an n-channel FET 624 and a p-channel FET 626, which are fabricated in semiconductive material on a semiconductor substrate with any fabrication and/or manufacturing process known to those skilled in the art. Intermesh memory array 600 also includes electrically conductive vias, such as conductive via 628, which electrically couples a transistor to one or more of the resistive memory components. For example, electrically conductive via 628 couples a transistor 630 to resistive memory components 632 and 618. Memory component 632 is electrically coupled to both conductive vias 628 and 634. Similarly, memory component 618 is electrically coupled to both conductive vias 628 and 636.

Although the resistive memory components are illustrated as resistors in FIG. 6, the memory components can be implemented with any combination of resistive memory devices and control elements as described with reference to memory component 102 (FIG. 1). Further, the memory components in intermesh memory array 600 can be implemented with any re-writeable data storage elements as well as any programmable, write-once memory components, such as the exemplary memory component 204 implemented with an anti-fuse device connected in series with a control element (FIG. 2). To simplify the description, FIG. 6 shows only a few memory components and associated transistors. Those skilled in the art will appreciate that intermesh memory array 600 can be fabricated with any number of memory components, transistors, and other drive and sense circuitry, such as sense amplifier 638, as part of a memory device.

In practice, intermesh memory array 600 can be fabricated as a semiconductor memory device with any fabrication and/or manufacturing process known to those skilled in the art. Further, the voltage control lines, such as positive drive voltage line 640 (+V) and sense voltage line 642 (+$V_A$), can be fabricated above semiconductor region 602 in device region 604 which includes the electrically resistive components.

Figure 7:
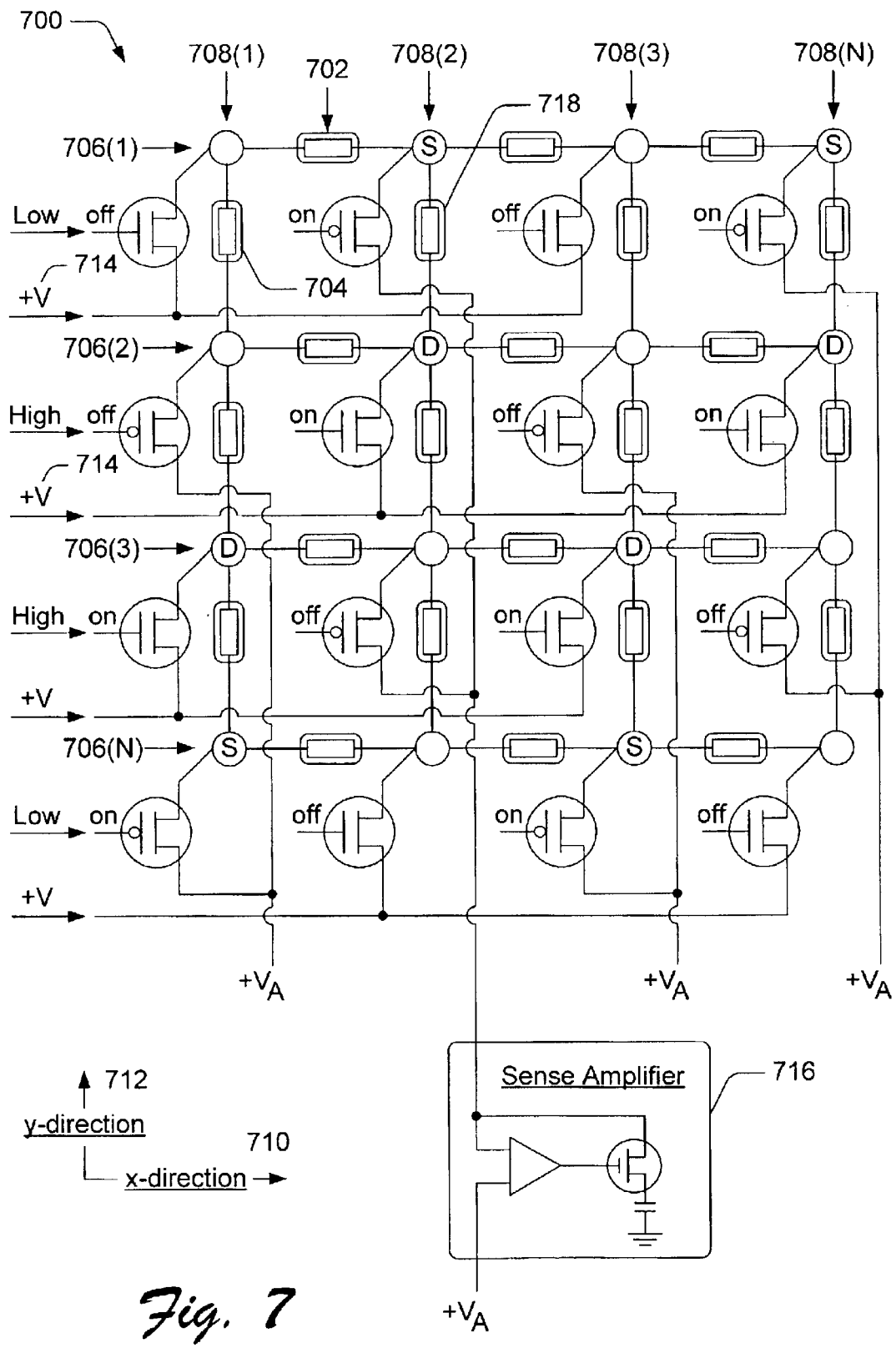
FIG. 7 illustrates an exemplary schematic diagram of the intermesh memory array shown in FIG. 4 where the intermesh memory array is formed with an embodiment of an exemplary memory component and electronic switches shown in FIG. 1.

FIG. 7 illustrates an exemplary schematic diagram of an embodiment of an intermesh memory array 700 similar to intermesh memory array 400 (FIG. 4) which is formed with rows and columns of memory components, such as memory components 702 and 704. The memory array 700 can be fabricated to include an embodiment of an exemplary memory component and the electronic switches shown in FIG. 1. Further, intermesh memory array 700 can be implemented as either of the exemplary intermesh memory arrays 500 (FIG. 5) and 600 (FIG. 6), where a device region that includes electrically resistive components is offset from a semiconductor region that includes electronic switches, such as the alternating n-channel and p-channel FETs.

Intermesh memory array 700 is implemented with transistor electronic switches such that either rows 706 or columns 708 of the memory components can be sensed at any one time. The memory components are arranged in rows 706 extending along an x-direction 710 and in columns 708 extending along a y-direction 712. Only a few memory components are shown to simplify the description, such as memory component 702 in row 706(1) and memory component 704 in column 708(1). In practice, memory array 700 can be implemented as a ROM (read-only memory) device having multiple memory components, as a programmable memory device having re-writeable data storage elements, or as a logic device, such as a one-time programmable gate array. The functionality of such a gate array would be similar to that of a field programmable gate array (FPGA) which is an integrated circuit that can be programmed after manufacture.

Additionally, the rows 706 of memory components and the columns 708 of memory components do not have to be fabricated perpendicular to each other as illustrated in FIG. 7. Those skilled in the art will recognize the various fabrication techniques and semiconductor design layouts that can be implemented to fabricate intermesh memory array 700.

The resistance value of any one memory component in the intermesh memory array 700 can be designed to be relatively high (e.g. 10 Meg ohms), which translates to a logic bit value of one, or relatively low (e.g. 100K ohms), which translates to a logic bit value of zero. Correlating a relatively high resistance memory component with a logic one, and a relatively low resistance memory component with a logic zero is an implementation design choice. Accordingly, a relatively high resistance memory component can be defined as a logic zero and a relatively low resistance memory component can be defined as a logic one.

The resistance value of a selected memory component is determinable and can be sensed by applying a voltage potential to a memory component and measuring the current that flows through the memory component. The resistance value is proportional to the sense current. During a read operation to determine the resistance value of a memory component, a decoder (not shown) selects two adjacent rows of transistors, or two adjacent columns of transistors, to apply a positive drive voltage 714. A second decoder (not shown) selects one or more columns 708 of memory components, or one or more rows 706 of memory components, to be connected to a sense amplifier 716 that senses the resistance value of a selected memory component in the intermesh memory array 700. The sense amplifier 716 can be implemented with sense amplifiers that include a differential, analog, or digital sense amplifier.

Each memory component in the intermesh memory array 700, such as memory component 702 in row 706(1) and memory component 704 in column 708(1), can be fabricated with an anti-fuse device that indicates a high resistance value when a relatively low voltage is applied across the anti-fuse device to read a particular memory component. A selected memory component can be programmed by applying a relatively high potential across the anti-fuse device to fuse the tunnel-junction in the device. When an anti-fuse device is programmed, it will indicate a low resistance when a relatively low voltage is applied across the particular memory component. The anti-fuse devices can be utilized as programmable switches that allow the intermesh memory array to be implemented as a programmable logic device. The anti-fuse devices can be utilized as both logic elements and as routing interconnects. Unlike traditional switching elements, the anti-fuse devices can be optimized to have a very low resistance once programmed which allows for high-speed interconnects and lower power levels.

FIG. 7 illustrates that when any two adjacent rows of transistors are driven high, such as in rows 706(2) and 706(3), a potential is applied to a memory component in each column 708 of the intermesh memory array 700 such that a resistance value of a memory component in any column can be determined. One or more sense amplifiers 716 sense the resistance value of a memory component in a selected column 708.

For example, when the transistors in row 706(2) are driven high, every other transistor in the row is turned on to apply a drive voltage to a memory component in every other corresponding column. As described above, the transistors are implemented as alternating n-channel FETs and p-channel FETs that are turned on and/or off with high and low voltages applied. Row 706(1) is driven low such that every other transistor in each column corresponding to the transistors that are turned on in row 706(2) are also turned on to apply a sense voltage to the memory components. Thus, the resistance value of memory component 718 in column 708(2) can be determined.

An example implementation of intermesh memory array 700 would include a sixty-four column and/or sixty-four row intermesh memory array implemented with one sense amplifier for every eight rows and/or columns (i.e., eight sense amplifiers). Thus, when two adjacent rows of transistors are driven high, the sense amplifiers can be utilized to read an eight-bit word at one time. The eight-bit word would be comprised of the logic state corresponding to the resistance value of a memory component in columns one, nine, seventeen, etc. up to column fifty-seven. A next eight-bit word would be comprised of the logic state corresponding to the resistance value of a memory component in columns two, ten, eighteen, etc. up to column fifty-eight, and so on.

Figure 8:
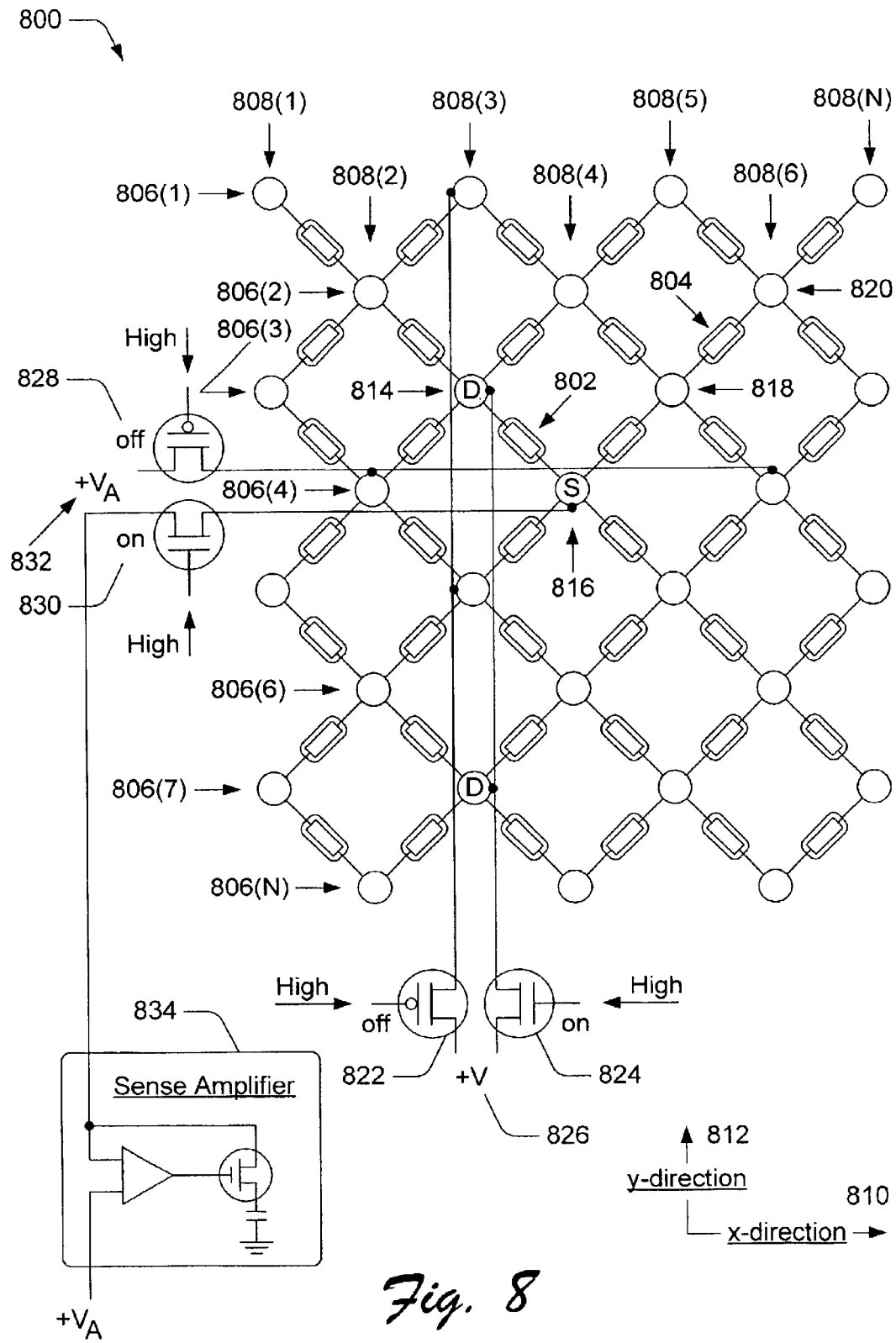
FIG. 8 illustrates an exemplary schematic diagram of an intermesh memory array formed with an embodiment of exemplary memory components electrically coupled to electronic switches.

FIG. 8 illustrates an embodiment of an intermesh memory array 800 formed with exemplary memory components, such as memory components 802 and 804. The memory components can be fabricated as an embodiment of an exemplary memory component 122, 124, or 204 as shown in FIGS. 1 and 2. Additionally, each memory component in intermesh memory array 800 can be fabricated with an anti-fuse device that indicates a high resistance value when a relatively low voltage is applied across the anti-fuse device to read a particular memory component.

A selected memory component can be programmed by applying a relatively high potential across the anti-fuse device to fuse the tunnel-junction in the device. When an anti-fuse device is programmed, it will indicate a low resistance when a relatively low voltage is applied across the particular memory component. The anti-fuse devices can be utilized as programmable switches that allow the intermesh memory array to be implemented as a programmable logic device.

Intermesh memory array includes alternating rows 806 of drive and sense connection nodes, and alternating columns 808 of drive and sense connection nodes. The rows 806 of drive and sense connection nodes are arranged in rows extending along an x-direction 810 and the columns 808 of drive and sense connection nodes are arranged in columns extending along a y-direction 812. As described above with reference to intermesh memory array 500 (FIG. 5), the drive and sense connection nodes can be implemented as electrically conductive vias (also referred to as "pillars") to offset the memory components from a transistor region of a memory device incorporating the intermesh memory array 800.

Intermesh memory array 800 is implemented with two transistor electronic switches per row and per column of the connection nodes such that the memory components electrically coupled to the transistors in either rows 806 or columns 808 can be sensed at any one time. The transistor electronic switches are implemented as n-channel FETs and as p-channel FETs.

The memory components are each electrically coupled to a drive connection node and to a sense connection node. For example, memory component 802 is electrically coupled to drive connection node 814 at row 806(3) and column 808(3), and coupled to sense connection node 816 at row 806(4) and column 808(4). Similarly, memory component 804 is electrically coupled to drive connection node 818 at row 806(3) and column 808(5), and to sense connection node 820 at row 806(2) and column 808(6).

Only a few memory components and connection nodes are shown to simplify the description. In practice, intermesh memory array 800 can be implemented as a ROM (read-only memory) device having multiple memory components, or as a logic device, such as a one-time programmable gate array. The functionality of such a gate array would be similar to that of a field programmable gate array (FPGA) which is an integrated circuit that can be programmed after manufacture. Additionally, the memory components, such as memory components 802 and 804, and the rows 806 and columns 808 of connection nodes do not have to be fabricated perpendicular to each other as illustrated in FIG. 8. Those skilled in the art will recognize the various fabrication techniques and semiconductor design layouts that can be implemented to fabricate intermesh memory array 800.

The resistance value of a selected memory component is determinable and can be sensed by applying a voltage potential to a memory component and measuring the current that flows through the memory component. The resistance value is proportional to the sense current. During a read operation to determine the resistance value of a memory component, a decoder (not shown) selects two drive transistors 822 and 824 to apply a positive drive voltage (+V) 826 to every other drive connection node in either the rows or columns. As illustrated in FIG. 7, every other drive connection node, such as drive connection node 814, has the positive drive voltage applied.

A second decoder (not shown) selects two sense transistors 828 and 830 to apply a sense voltage (+$V_A$) 832 to every other sense connection node in either the rows or columns. As illustrated, every other sense connection node, such as sense connection node 816, has the sense voltage applied. One or more of the memory components electrically coupled to the transistors in either rows 806 or columns 808 can be connected to a sense amplifier 834 that senses the resistance value of a selected memory component in the intermesh memory array 800.

FIG. 8 illustrates that when any two drive transistors are driven high, such as p-channel FET 822 and n-channel FET 824, and when two sense transistors are driven high, such as p-channel FET 828 and n-channel FET 830, a potential is applied to memory component 802. Sense amplifier 834 senses the resistance value of memory component 802. Alternatively, the circuit logic can be inverted such that any two drive transistors are driven low in combination with two corresponding sense transistors driven low to apply a potential to a memory component.

Exemplary Intermesh Memory Device Application Environment

Figure 9:
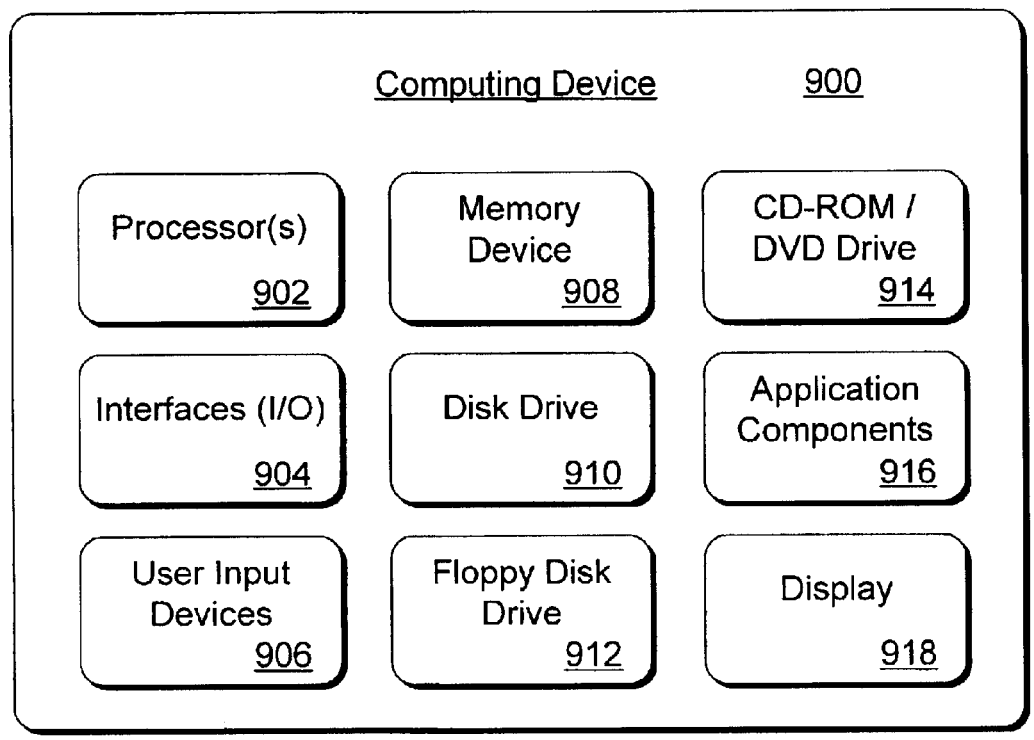
FIG. 9 is block diagram that illustrates various components of an exemplary computing device that can be utilized to implement an embodiment of an intermesh memory device.

FIG. 9 illustrates various components of an exemplary computing device 900 that can be utilized to implement an embodiment of an intermesh memory device as described herein. Computing device 900 is only one memory device application environment, and those skilled in the art will recognize that any number of computing type devices having a memory device can be utilized to implement the data storage techniques. For example, computing type devices include multifunction devices which, as the name implies, is a device for multiple functions which are related to, but not limited to, printing, copying, scanning, to include image acquisition and text recognition, sending and receiving faxes, print media handling, and/or data communication, either by print media or electronic media, such as email or electronic fax.

Further, computing type devices include, but are not limited to, personal computers, server computers, client devices, microprocessor-based systems, set top boxes, programmable consumer electronics, network PCs, minicomputers, and hand-held portable devices such as a personal digital assistant (PDA), a portable computing device, and similar mobile computing devices.

Computing device 900 includes one or more processors 902, input/output interfaces 904 for the input and/or output of data, and user input devices 906. Processor(s) 902 process various instructions to control the operation of computing device 900, while input/output interfaces 904 provide a mechanism for computing device 900 to communicate with other electronic and computing devices. User input devices 906 can include a keyboard, mouse, pointing device, and/or other mechanisms to interact with, and to input information to computing device 900.

Input/output interfaces 904 can include serial, parallel, and/or network interfaces. A network interface allows devices coupled to a common data communication network to communicate information with computing device 900. Similarly, a communication interface, such as a serial and/or parallel interface, a USB interface, an Ethernet interface, and/or any combination of similar communication interfaces provides a data communication path directly between computing device 900 and another electronic or computing device.

Computing device 900 also includes a memory device 908 (such as ROM and/or MRAM device), a disk drive 910, a floppy disk drive 912, and a CD-ROM and/or DVD drive 914, all of which provide data storage mechanisms for computing device 900. Memory device 908 can be implemented with any one of the memory devices 100 (FIG. 1), 200 (FIG. 2), and 300 (FIG. 3). Those skilled in the art will recognize that any number and combination of memory and storage devices can be connected with, or implemented within, computing device 900. Although not shown, a system bus typically connects the various components within computing device 900.

Computing device 900 also includes application components 916 and can include an integrated display device 918, such as for a multifunction device display on a device control panel, or for a personal digital assistant (PDA), a portable computing device, and similar mobile computing devices. Application components 916 provide a runtime environment in which software applications or components can run or execute on processor(s) 902. Further, an application component 916 can be implemented as a data storage application to perform the data storage techniques described herein.

For a multifunction implementation of computing device 900, such as for a device that prints, copies, scans, and the like, device 900 can include a print unit that selectively applies an imaging medium such as liquid ink or toner to a print media in accordance with print data corresponding to a print job. Further, device 900 can include a scan unit that can be implemented as an optical scanner to produce machine-readable image data signals that are representative of a scanned image, such as a photograph or a page of printed text. The image data signals produced by scan unit can be used to reproduce the scanned image on a display device or with a printing device.

Methods for Data Storage with an Intermesh Memory Device

Figure 10:
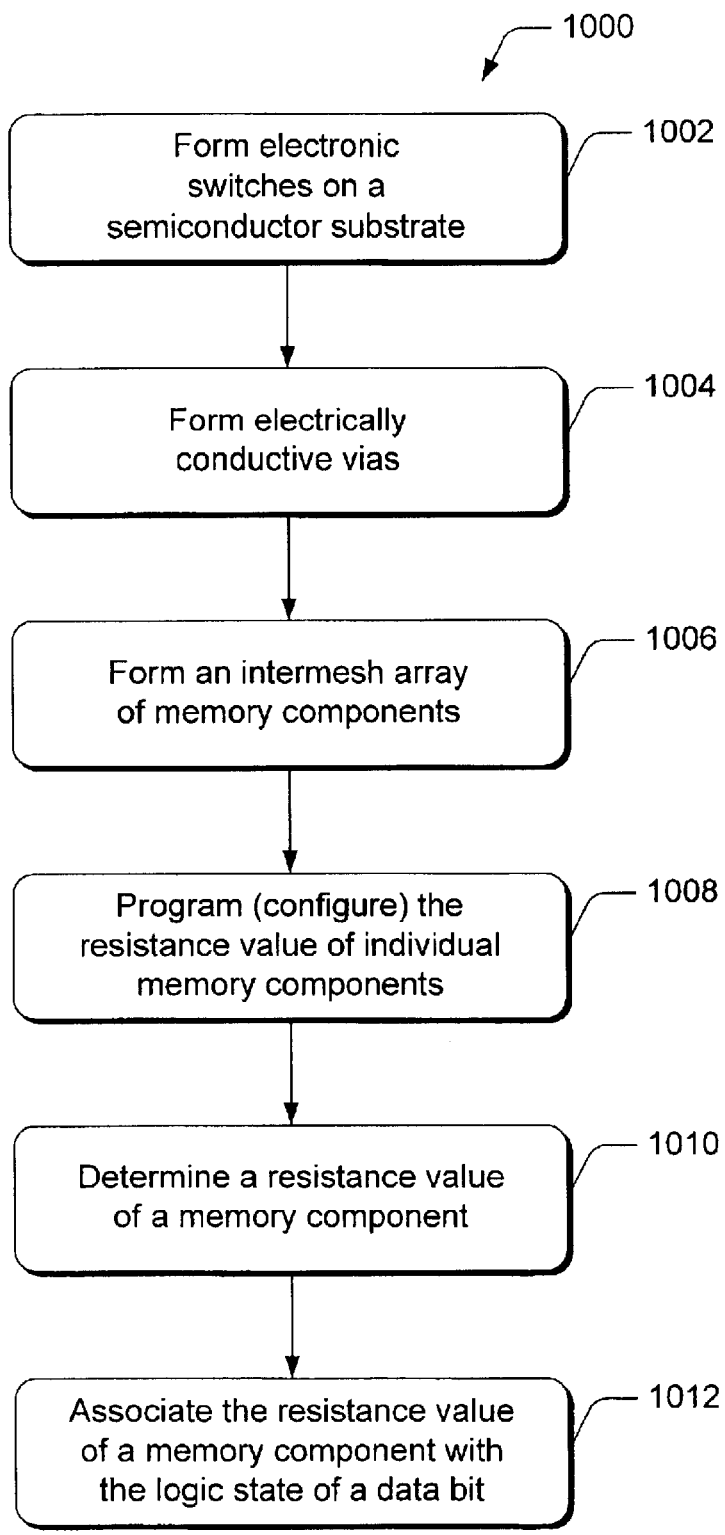
FIG. 10 is a flow diagram that describes an exemplary method for making and utilizing an intermesh memory device.

FIG. 10 illustrates a method 1000 for implementing data storage with an intermesh memory device. The order in which the method is described is not intended to be construed as a limitation, and any number of the described method blocks can be combined in any order to implement the method for data storage. Furthermore, the method can be implemented in any suitable hardware, software, firmware, or combination thereof.

At block 1002, electronic switches are formed on a semiconductor substrate. The electronic switches can be formed with voltage controlled switches, such as field effect transistors. For example, intermesh memory arrays 500, 600, and 700 (FIGS. 5, 6, and 7, respectively) can include alternating p-channel FETs and n-channel FETs formed on a semiconductor substrate. Further, intermesh memory array 800 (FIG. 8) can include p-channel FETs and/or n-channel FETs formed on a semiconductor substrate.

At block 1004, electrically conductive vias are formed. For example, conductive via 514 is formed to electrically couple electronic switch 516 (e.g., a transistor) to resistive memory components 510 and 512 (FIG. 5).

At block 1006, an intermesh array of memory components are formed. For example, device region 504 of intermesh memory array 500 includes electrically resistive components, such as resistive memory components 510 and 512, that are fabricated in the device region which is offset from the semiconductive material in the semiconductor region 502 (FIG. 5). Memory component 510 is electrically coupled to transistors, such as transistor 516, with conductive vias 514 and 518. Similarly, memory component 512 is electrically coupled to transistors, such as transistor 516, with conductive vias 514 and 520. Further, intermesh memory array 600 includes a first memory array 606 that is offset from a second memory array 614. The first set of memory components that form the first memory array 606 intersect, overlap, and/or are substantially perpendicular to the second set of memory components which form the second memory array 614.

At block 1008, the resistance value of individual memory components is programmed by applying a voltage to the individual memory components. For example, the resistance value of an anti-fuse device implemented as a memory component can be configured by applying a potential to the write-once device. Further, the resistance value of the memory components in an intermesh memory array can be configured by exposing an individual memory component to light and/or to a heat source.

At block 1010, a resistance value of a memory component is determined when a potential is applied to the memory component. For example, when both of the transistors 206 and 232 in column 240(2) are turned on with the applied high voltage 222 and low voltage 230, respectively, a potential is applied to memory component 204 (FIG. 2). The potential is derived from a positive drive voltage 250 (+V) at an input, or drive node 210, of memory component 204 and from a sense voltage 252 (+$V_A$) at an output, or sense node 254, of memory component 204. A current path 256 is created through transistor 206, memory component 204, and transistor 232. The sense amplifier 258 senses the resistance value of memory component 204.

At block 1012, the determined resistance value of a memory component is associated with a logic state of a data bit. For example, an application component 916 of computing device 900, or another electronic device implementing an intermesh memory array described herein, can read the resistance value of memory components and derive a bit sequence that represents any form of electronic data, such as computer-executable instructions.

Figure 11:
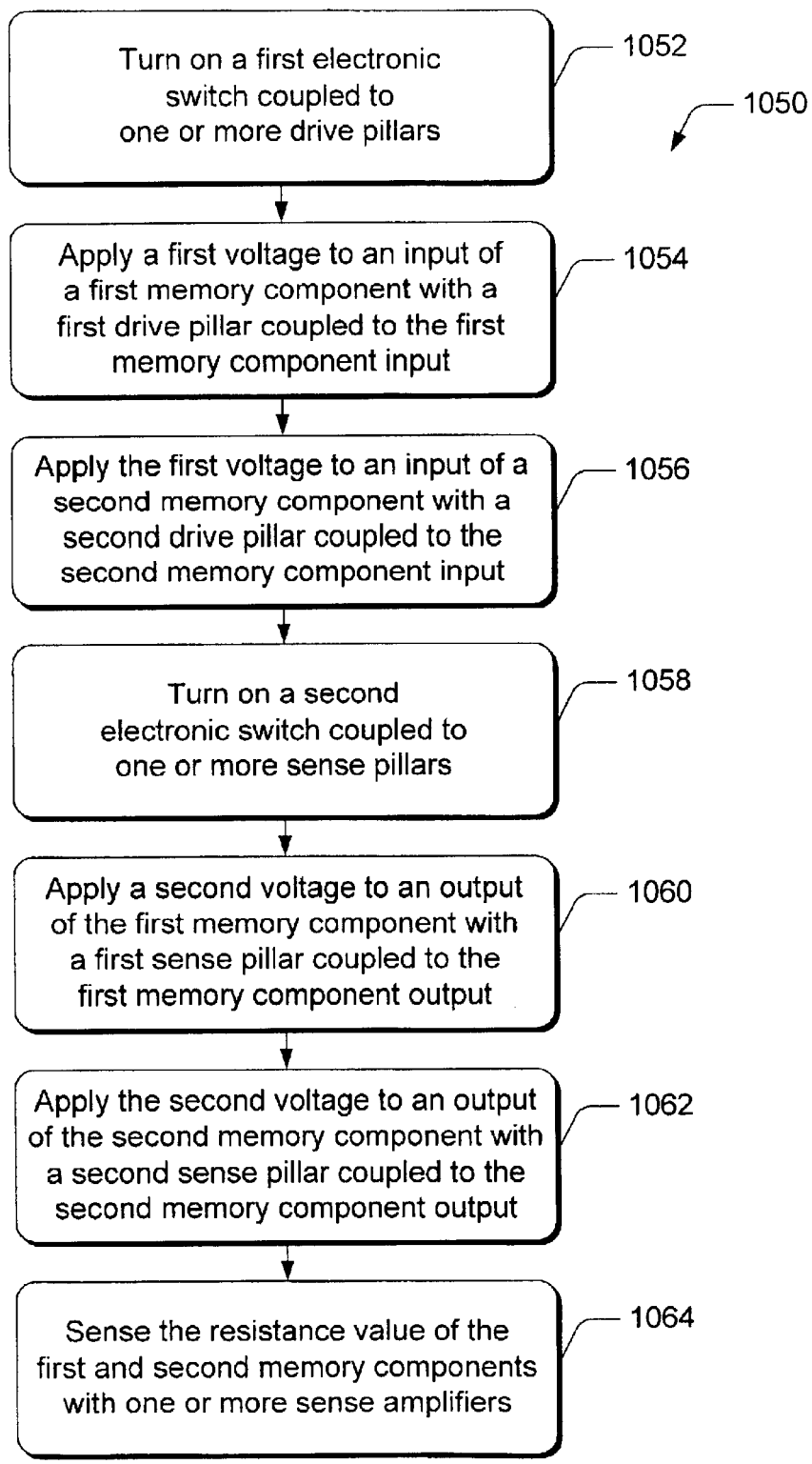
FIG. 11 is a flow diagram that describes an exemplary method for implementing data storage with an intermesh memory device.

FIG. 11 illustrates a method 1050 for implementing data storage with an intermesh memory device. The order in which the method is described is not intended to be construed as a limitation, and any number of the described method blocks can be combined in any order to implement the method for data storage. Furthermore, the method can be implemented in any suitable hardware, software, firmware, or combination thereof.

At block 1052, a first electronic switch coupled to one or more drive pillars is turned on. For example, transistor 206 coupled to drive pillar 210 is turned on when high voltage 222 is applied to the transistors in row 202(2) (FIG. 2).

At block 1054, a first voltage is applied to an input of a first memory component with a first drive pillar which is coupled to the input of the first memory component. For example, drive voltage 250 (+V) is applied to the input of memory component 204 with drive pillar 210.

At block 1056, the first voltage is applied to an input of a second memory component with a second drive pillar which is coupled to the input of the second memory component. For example, drive voltage 714 (+V) is applied to the input of two memory components coupled to two respective drive pillars (D) in row 706(2) (FIG. 7). Further, drive voltage 826 (+V) is applied to the input of a first memory component 802 with drive pillar 814 in row 806(3), and the drive voltage 826 is also applied to the input of a second memory component with a drive pillar in row 806(7) (FIG. 8).

At block 1058, a second electronic switch coupled to one or more sense pillars is turned on. For example, transistor 232 coupled to sense pillar 254 is turned on when low voltage 230 is applied to the transistors in row 202(1) (FIG. 2).

At block 1060, a second voltage is applied to an output of the first memory component with a first sense pillar which is coupled to the output of the first memory component. For example, sense voltage 252 (+$V_A$) is applied to the output of memory component 204 with sense pillar 254 (FIG. 2).

At block 1062, the second voltage is applied to an output of the second memory component with a second sense pillar which is coupled to the output of the second memory component. For example, sense voltage +$V_A$ is applied to the output of two memory components coupled to two respective sense pillars (S) in columns 708(2) and 708(N) (FIG. 7). Further, sense voltage 832 (+$V_A$) is applied to the output of a first memory component 802 with sense pillar 816 in row 806(4) (FIG. 8).

At block 1064, the resistance value of the first and second memory components is sensed. For example, memory components 310 and 312 in columns 306(1) and 306(3), respectively, are sensed with one or more sense amplifiers 308 (FIG. 3). Similarly, memory components 416 and 418 in rows 406(2) and 406(4), respectively, are sensed with one or more sense amplifiers 408 (FIG. 4).

Conclusion

Although the invention has been described in language specific to structural features and/or methods, it is to be understood that the invention defined in the appended claims is not necessarily limited to the specific features or methods described. Rather, the specific features and methods are disclosed as preferred forms of implementing the claimed invention.

What is claimed:

1. An intermesh memory device, comprising:
   memory components each configured to have a determinable resistance value, the memory components formed as a first memory array with a first set of the memory components and formed as a second memory array with a second set of the memory components, the first and second memory arrays each having rows of the memory components substantially perpendicular to columns of the memory components such that the first memory array rows and columns of the memory components are interconnected with the second memory array rows and columns of the memory components;
   electronic switches each configured to control current through one or more of the memory components such that a potential is applied to the one or more memory components; and
   wherein a first electronic switch is electrically coupled to drive an input of a memory component and a second electronic switch is electrically coupled to sense an output of the memory component, the first electronic switch and the second electronic switch configured together to apply a potential to the memory component.

2. An intermesh memory device as recited in claim 1, wherein the memory components form a first region and the electronic switches form a second region, the first region offset substantially vertical from the second region.

3. An intermesh memory device as recited in claim 1, wherein the memory components form a first region and the electronic switches form a second region, the first region offset from the second region with electrically conductive vias each configured to electrically couple one or more of the memory components to one or more of the electronic switches.

4. An intermesh memory device comprising:
   memory components each configured to have a determinable resistance value, the memory components forming a memory array with a first set of the memory components substantially perpendicular to a second set of the memory components;
   electronic switches each configured to control current through one or more of the memory components such that a potential is applied to the one or more memory components;
   wherein a first electronic switch is electrically coupled to drive an input of a memory component and a second electronic switch is electrically coupled to sense an output of the memory component, the first electronic switch and the second electronic switch configured together to apply a potential to the memory component; and
   wherein the memory components form a first region and the electronic switches form a second region, the first region offset from the second region and the first region substantially parallel to the second region.

5. An intermesh memory device as recited in claim 1, wherein the first set of the memory components are offset substantially vertically from the second set of the memory components.

6. An intermesh memory device, comprising:
   memory components each configured to have a determinable resistance value, the memory components forming a memory array with a first set of the memory components substantially perpendicular to a second set of the memory components;
   electronic switches each configured to control current through one or more of the memory components such that a potential is applied to the one or more memory components;
   wherein a first electronic switch is electrically coupled to drive an input of a first memory component and a second electronic switch is electrically coupled to sense an output of the first memory component, the first electronic switch and the second electronic switch configured together to apply a potential to the first memory component; and
   wherein the first electronic switch is electrically coupled to drive an input of at least a second memory component and a third electronic switch is electrically coupled to sense an output of the second memory component, the first electronic switch and the third electronic switch configured together to apply a potential to the second memory component.

7. An intermesh memory device as recited in claim 1, wherein one or more of the electronic switches are voltage controlled switches.

8. An intermesh memory device, comprising:
   memory components each configured to have a determinable resistance value, the memory components forming a memory array with a first set of the memory components substantially perpendicular to a second set of the memory components;
   electronic switches each configured to control current through one or more of the memory components such that a potential is applied to the one or more memory components, wherein a first set of the electronic switches are p-channel field effect transistors and wherein a second set of the electronic switches are n-channel field effect transistors; and
   wherein a first electronic switch is electrically coupled to drive an input of a memory component and a second electronic switch is electrically coupled to sense an output of the memory component, the first electronic switch and the second electronic switch configured together to apply a potential to the memory component.

9. An intermesh memory device, comprising:
   memory components each configured to have a determinable resistance value, the memory components forming a memory array with a first set of the memory components substantially perpendicular to a second set of the memory components;
   electronic switches each configured to control current through one or more of the memory components such that a potential is applied to the one or more memory components; and
   wherein a first electronic switch is an n-channel field effect transistor electrically coupled to drive an input of a memory component and a second electronic switch is a p-channel field effect transistor electrically coupled to sense an output of the memory component, the first electronic switch and the second electronic switch configured together to apply a potential to the memory component.

10. An intermesh memory device as recited in claim 1, wherein an individual memory component is formed with electrically resistive material configured to indicate the determinable resistance value when the potential is applied to the individual memory component.

11. An intermesh memory device as recited in claim 1, wherein an individual memory component includes a resistor device.

12. An intermesh memory device as recited in claim 1, wherein an individual memory component includes an anti-fuse device.

13. An intermesh memory device as recited in claim 1, wherein an individual memory component includes an anti-fuse device electrically coupled with a control element.

14. An intermesh memory device as recited in claim 1, wherein an individual memory component includes an anti-fuse device configured to indicate a resistance value corresponding to a logic state when the potential is applied to the individual memory component.

15. An intermesh memory device as recited in claim 1, wherein an individual memory component includes an anti-fuse device electrically coupled with a control element, the anti-fuse device being configured to indicate a first resistance value corresponding to a first logic state, and the anti-fuse device being configurable to indicate a second resistance value corresponding to a second logic state.

16. An intermesh memory device as recited in claim 1, further comprising one or more sense amplifiers each configured to determine the resistance value of one or more of the memory components.

17. An integrated circuit comprising the intermesh memory device as recited in claim 1.

18. An electronic device comprising the intermesh memory device as recited in claim 1.

19. A portable computing device comprising the intermesh memory device as recited in claim 1.

20. A printing device comprising the intermesh memory device as recited in claim 1.

21. An electrical structure, comprising:
electronic switches fabricated in a semiconductive material on a semiconductor substrate;
electrically resistive components fabricated in a device region offset from the semiconductive material, the electrically resistive components configured to form an intermesh array of memory cells formed with a first set of the electrically resistive components intersected by a second set of the electrically resistive components; and
electrically conductive vias each configured to electrically couple one or more of the electronic switches to an electrically resistive component of the first set and to an electrically resistive component of the second set.

22. An electrical structure as recited in claim 21, wherein the electrically resistive components are offset over the electronic switches.

23. An electrical structure as recited in claim 21, wherein the first set of the electrically resistive components are offset substantially vertically from the second set of the electrically resistive components.

24. An electrical structure as recited in claim 21, wherein the first set of the electrically resistive components are fabricated in a first region and the second set of the electrically resistive components are fabricated in a second region, the first region offset from the second region and the first region substantially parallel to the second region.

25. An electrical structure as recited in claim 21, wherein a first electronic switch is electrically coupled to drive an electrically resistive component and a second electronic switch is electrically coupled to sense the electrically resistive component, the first electronic switch and the second electronic switch configured together to apply a potential to the electrically resistive component.

26. An electrical structure, comprising:
electronic switches fabricated in a semiconductive material on a semiconductor substrate, the electronic switches including a first set of p-channel field effect transistors and a second set of n-channel field effect transistors;
electrically resistive components fabricated in a device region offset from the semiconductive material, the electrically resistive components configured to form an intermesh array of memory cells formed with a first set of the electrically resistive components intersected by a second set of the electrically resistive components; and
electrically conductive vias configured to electrically couple one or more of the electronic switches to one or more of the electrically resistive components.

27. An electrical structure, comprising:
electronic switches fabricated in a semiconductive material on a semiconductor substrate, the electronic switches configured as an array of voltage controlled switches, the array including p-channel field effect transistors alternating with n-channel field effect transistors;
electrically resistive components fabricated in a device region offset from the semiconductive material, the electrically resistive components configured to form an intermesh array of memory cells formed with a first set of the electrically resistive components intersected by a second set of the electrically resistive components; and
electrically conductive vias configured to electrically couple one or more of the electronic switches to one or more of the electrically resistive components.

28. An electrical structure as recited in claim 21, wherein the electrically resistive components are each configured to indicate a determinable resistance value when a potential is applied to an individual electrically resistive component.

29. An electrical structure as recited in claim 21, wherein the electrically resistive components include a programmable anti-fuse device.

30. An electrical structure as recited in claim 21, wherein the electrically resistive components include a programmable anti-fuse device electrically coupled with a control element.

31. An integrated circuit comprising the electrical structure as recited in claim 21.

32. A method, comprising:
forming electronic switches on a semiconductor substrate;
forming electrically conductive vias; and
forming memory components in an intermesh array that includes a first set of the memory components and includes a second set of the memory components, the first set of the memory components being substantially perpendicular to the second set of the memory components such that the first set of the memory components are interconnected with the second set of the memory components, a first set memory component being electrically coupled to a first electronic switch with a first electrically conductive via and the first set memory component being electrically coupled to a second electronic switch with a second electrically conductive via, and a second set memory component being electrically coupled to the second electronic switch with the second electrically conductive via and the second set memory component being electrically coupled to a third electronic switch with a third electrically conductive via.

33. A method as recited in claim 32, further comprising determining a resistance value of a memory component when a potential is applied to the memory component.

34. A method as recited in claim 32, further comprising determining a resistance value of a memory component when the first electronic switch and the second electronic switch are together controlled to apply a potential to the memory component.

35. A method as recited in claim 32, further comprising associating a logic state of a data bit with a resistance value of a memory component.

36. A method as recited in claim 32, wherein forming the electronic switches includes forming the electronic switches with field effect transistors.

37. A method comprising:
   forming electronic switches as alternating p-channel field effect transistors and n-channel field effect transistors on a semiconductor substrate;
   forming electrically conductive vias;
   forming memory components in an intermesh array, an individual memory component being electrically coupled to a first electronic switch with a first electrically conductive via and the individual memory component being electrically coupled to a second electronic switch with a second electrically conductive via.

38. A method as recited in claim 32, wherein forming the electronic switches includes forming the electronic switches with voltage controlled switches.

39. A method as recited in claim 32, wherein forming the memory components includes forming the memory components in a device region that is offset from the semiconductor substrate.

40. A method as recited in claim 32, wherein forming the memory components includes forming the memory components with electrically resistive material.

41. A method as recited in claim 32, wherein forming the memory components includes forming the memory components with an anti-fuse device.

42. A method as recited in claim 32, wherein forming the memory components includes forming the memory components with an anti-fuse device electrically coupled with a control element.

43. A method as recited in claim 32, wherein forming the memory components includes forming the first set of the memory components intersecting with the second set of the memory components.

44. A method as recited in claim 32, further comprising programming the resistance value of individual memory components by applying a voltage to the individual memory components.

45. A method as recited in claim 32, further comprising configuring the resistance value of individual memory components by exposing the individual memory components to light.

46. A method as recited in claim 32, further comprising configuring the resistance value of individual memory components by exposing electrically resistive material forming the individual memory components to light.

47. A method as recited in claim 32, further comprising configuring the resistance value of individual memory components by exposing the individual memory components to heat.

48. A method as recited in claim 32, further comprising configuring the resistance value of individual memory components by exposing electrically resistive material forming the individual memory components to heat.

49. An electronic device, comprising:
   means for applying a drive voltage with a drive pillar coupled to drive an input of a first memory component in an intermesh memory device;
   means for applying a sense voltage with a sense pillar coupled to sense an output of the first memory component; and
   means for sensing a resistance value of the first memory component, the resistance value being determinable when the drive pillar and the sense pillar are enabled.

50. An electronic device as recited in claim 49, further comprising:
   means for applying the drive voltage with the drive pillar coupled to drive an input of a second memory component in the intermesh memory device;
   means for applying the sense voltage with a second sense pillar coupled to sense an output of the second memory component; and
   means for sensing a resistance value of the second memory component, the resistance value being determinable when the drive pillar and the second sense pillar are enabled.

51. An electronic device, comprising:
   means for enabling a first electronic switch coupled to apply a drive voltage to an input of a first memory component in a first array of memory components in an intermesh memory device;
   means for enabling a second electronic switch coupled to apply a sense voltage to an output of the first memory component;
   means for sensing a resistance value of the first memory component, the resistance value being determinable when the first electronic switch and the second electronic switch are enabled;
   means for enabling the first electronic switch coupled to apply the drive voltage to an input of a second memory component in a second array of memory components in the intermesh device;
   means for enabling a third electronic switch coupled to apply a second sense voltage to an output of the second memory component; and
   means for sensing a resistance value of the second memory component, the resistance value being determinable when the first electronic switch and the third electronic switch are enabled.

52. An electronic device, comprising:
   means for enabling a first electronic switch coupled to apply a drive voltage to an input of a row memory component in an intermesh memory device;
   means for enabling a second electronic switch coupled to apply a sense voltage to an output of the row memory component; and
   means for sensing a resistance value of the row memory component, the resistance value being determinable when the first electronic switch and the second electronic switch are enabled;
   means for enabling the first electronic switch coupled to apply a drive voltage to an input of a column memory component in the intermesh memory device;
   means for enabling a third electronic switch coupled to apply a sense voltage to an output of the column memory component; and means for sensing a resistance value of the column memory component, the resistance value being determinable when the first electronic switch and the third electronic switch are enabled.

53. A method, comprising:

applying a first voltage to an input of a first memory component in an intermesh memory device, the first voltage being applied with a drive pillar coupled to the input of the first memory component;

applying a second voltage to an output of the first memory component, the second voltage being applied with a sense pillar coupled to the output of the first memory component; and sensing a resistance value of the first memory component, the resistance value being determinable when the drive pillar and the sense pillar apply a potential to the first memory component.

54. A method as recited in claim 53, further comprising:

applying the first voltage to an input of a second memory component in the intermesh memory device, the first voltage being applied with the drive pillar coupled to the input of the second memory component;

applying the second voltage to an output of the second memory component, the second voltage being applied with a second sense pillar coupled to the output of the second memory component; and sensing a resistance value of the second memory component, the resistance value being determinable when the drive pillar and the second sense pillar apply a potential to the second memory component.

55. A method as recited in claim 53, further comprising:

turning on a first electronic switch coupled to the drive pillar to apply the first voltage to the input of the first memory component; and turning on a second electronic switch coupled to the sense pillar to apply the second voltage to the output of the first memory component.

56. A method as recited in claim 54, further comprising:

turning on a first electronic switch coupled to the drive pillar to apply the first voltage to the input of the second memory component; and turning on a second electronic switch coupled to the second sense pillar to apply the second voltage to the output of the second memory component.

57. A method as recited in claim 53, further comprising:

applying the first voltage to an input of a second memory component in an intermesh memory device, the first voltage being applied with a second drive pillar coupled to the input of the second memory component;

applying the second voltage to an output of the second memory component, the second voltage being applied with a second sense pillar coupled to the output of the second memory component; and sensing a resistance value of the second memory component, the resistance value being determinable when the second drive pillar and the second sense pillar apply a potential to the second memory component.

58. A method as recited in claim 57, further comprising:

turning on a first electronic switch coupled to the drive pillar to apply the first voltage to the input of the first memory component;

turning on a second electronic switch coupled to the second drive pillar to apply the first voltage to the input of the second memory component;

turning on a third electronic switch coupled to the sense pillar to apply the second voltage to the output of the first memory component; and turning on a fourth electronic switch coupled to the second sense pillar to apply the second voltage to the output of the second memory component.

59. A method as recited in claim 57, further comprising:

turning on a first electronic switch coupled to the drive pillar to apply the first voltage to the input of the first memory component and coupled to the second drive pillar to apply the first voltage to the input of the second memory component; and turning on a second electronic switch coupled to the sense pillar to apply the second voltage to the output of the first memory component and coupled to the second sense pillar to apply the second voltage to the output of the second memory component.

* * * * *